US006559648B2

United States Patent
Baumgaertl et al.

(10) Patent No.: US 6,559,648 B2
(45) Date of Patent: May 6, 2003

(54) METHOD FOR OPERATING AN ELECTRONIC OVERCURRENT TRIP OF A POWER CIRCUIT BREAKER

(75) Inventors: Ulrich Baumgaertl, Berlin (DE); Manfred Schiller, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 88 days.

(21) Appl. No.: 09/980,907

(22) PCT Filed: May 31, 2001

(86) PCT No.: PCT/DE00/01803
§ 371 (c)(1),
(2), (4) Date: Dec. 4, 2001

(87) PCT Pub. No.: WO00/76046
PCT Pub. Date: Dec. 14, 2000

(65) Prior Publication Data
US 2002/0158633 A1 Oct. 31, 2002

(30) Foreign Application Priority Data
Jun. 4, 1999 (DE) ............................ 199 27 029

(51) Int. Cl.[7] ................. G01R 31/02; G01R 31/08; G01R 33/00
(52) U.S. Cl. ............... 324/424; 324/522; 324/520; 324/117 R; 324/117 H; 324/127
(58) Field of Search .................. 324/424, 522, 324/520, 127, 117 R, 117 H

(56) References Cited

U.S. PATENT DOCUMENTS

| | | | | |
|---|---|---|---|---|
| 3,593,124 A | * | 7/1971 | Cahen | 324/522 |
| 4,023,100 A | * | 5/1977 | Smutny | 324/117 R |
| 4,794,327 A | * | 12/1988 | Fernandes | 324/126 |
| 4,896,089 A | * | 1/1990 | Kliman et al. | 318/701 |
| 5,015,945 A | | 5/1991 | Radun | 324/127 |
| 5,815,391 A | | 9/1998 | Pelly | 363/98 |
| 5,877,691 A | * | 3/1999 | Suptiz et al. | 340/638 |
| 6,064,191 A | * | 5/2000 | Turner | 324/127 |
| 6,094,044 A | * | 7/2000 | Kustera et al. | 324/127 |
| 6,366,076 B1 | * | 4/2002 | Karrer et al. | 324/117 R |

FOREIGN PATENT DOCUMENTS

DE    26 56 817 A1    6/1978

* cited by examiner

Primary Examiner—N. Le
Assistant Examiner—Wasseem H. Hamdan
(74) Attorney, Agent, or Firm—Harness, Dickey & Pierce P.L.C.

(57) ABSTRACT

In power circuit breakers including a current transformer with a current detection coil without any iron and including an integration circuit connected downstream from the current detection coil, the unavoidable time constant of the integration circuit can lead to spurious trappings. This is avoided by a method in which the instantaneous values of the current are detected and stored at defined periodic intervals. The stored measured values are compared on the basis of polarity and magnitude. If it is found that the stored values have the same polarity and fall monotonally, it is assumed that the DC element is originating from the integrator and a tripping inhibit signal is set in the electronic release of the power circuit breaker.

7 Claims, 2 Drawing Sheets

METHOD FOR OPERATING AN ELECTRONIC OVERCURRENT TRIP OF A POWER CIRCUIT BREAKER

This application is the national phase under 35 U.S.C. §371 of PCT International Application No. PCT/DE00/01803 which has an International filing date of May 31, 2000, which designated the United States of America, the entire contents of which are hereby incorporated by reference.

FIELD OF THE INVENTION

The invention generally relates to a method for operating an electronic overcurrent release for a power circuit breaker. More preferably, it relates to a method for operating one which includes a current transformer for supplying the overcurrent release with a signal which is proportional to the current through the power circuit breaker. Even more preferably, the current transformer includes a current detection coil without iron, and an integration circuit is connected downstream from the current detection coil.

BACKGROUND OF THE INVENTION

Current transformers having a current detection coil without any iron are used in order to monitor a very wide current range with as little error as possible. The output signal from such a current detection coil, which is also known as a Rogowsli coil, is processed in the integration circuit. This is done in order to convert the signal, which is based on the Rogowski principle and proportional to the current change, to a signal which is directly proportional to the current to be measured. This conversion does not intrinsically involve any difficulties since, in principle, an R-C combination is adequate for use as the integration circuit. However, such an integration circuit cannot follow changes in the current to be measured at an indefinitely fast rate. It is thus possible for a signal to appear at the output of the integration circuit even though the current to be measured has assumed a value ZERO.

The described behavior of the integration circuit can lead to difficulties during operation of the power circuit breaker if a signal appears at the output of the integration circuit, when no current is any longer flowing, of such a magnitude that further processing of the signal in the overcurrent release leads to the emission of a tripping command to the power circuit breaker.

SUMMARY OF THE INVENTION

The invention is based on an object of preventing spurious tripping resulting from the behavior of the integration circuit.

According to the invention, this object is achieved by the following steps in the method mentioned initially:
a) measurement of the instantaneous value of the signal from the current transformer at defined periodic intervals,
b) storage of at least two successive measured values obtained in step a),
c) comparison of each of the measured values with the at least two previously stored measured values, and
d) output of a tripping inhibit signal to the electronic overcurrent release if all the measured values correspond to a monotonically falling function and the difference between successive measured values is at least 10%.

For the purposes of the invention, it is recommended that the time interval between the measured values be short in comparison to the time constant of the integration circuit. More preferably, it is about 4.5 ms when the frequency of the current to be measured is about 50 Hz.

For the practical implementation of the described method, it has been found to be sufficient for successively following comparison of the measured values, if these measured values are read to a three-cell ring buffer.

As a further solution for the object, the invention a method in which the tripping threshold value of the overcurrent release is increased by a basic offset value for short-time-delay tripping and ground-fault tripping, which basic offset value corresponds to a DC element which is emitted by the integration circuit in the event of an interruption in the current, and in that the basic offset value can be varied as a function of a decay function of the DC element.

BRIEF DESCRIPTION OF THE DRAWINGS

The invention is explained in more detail in the following text with reference to the exemplary embodiment which is illustrated in the figures.

DETAILED DESCRIPTION OF THE PREFERRED EMBODIMENTS

Figure 1:
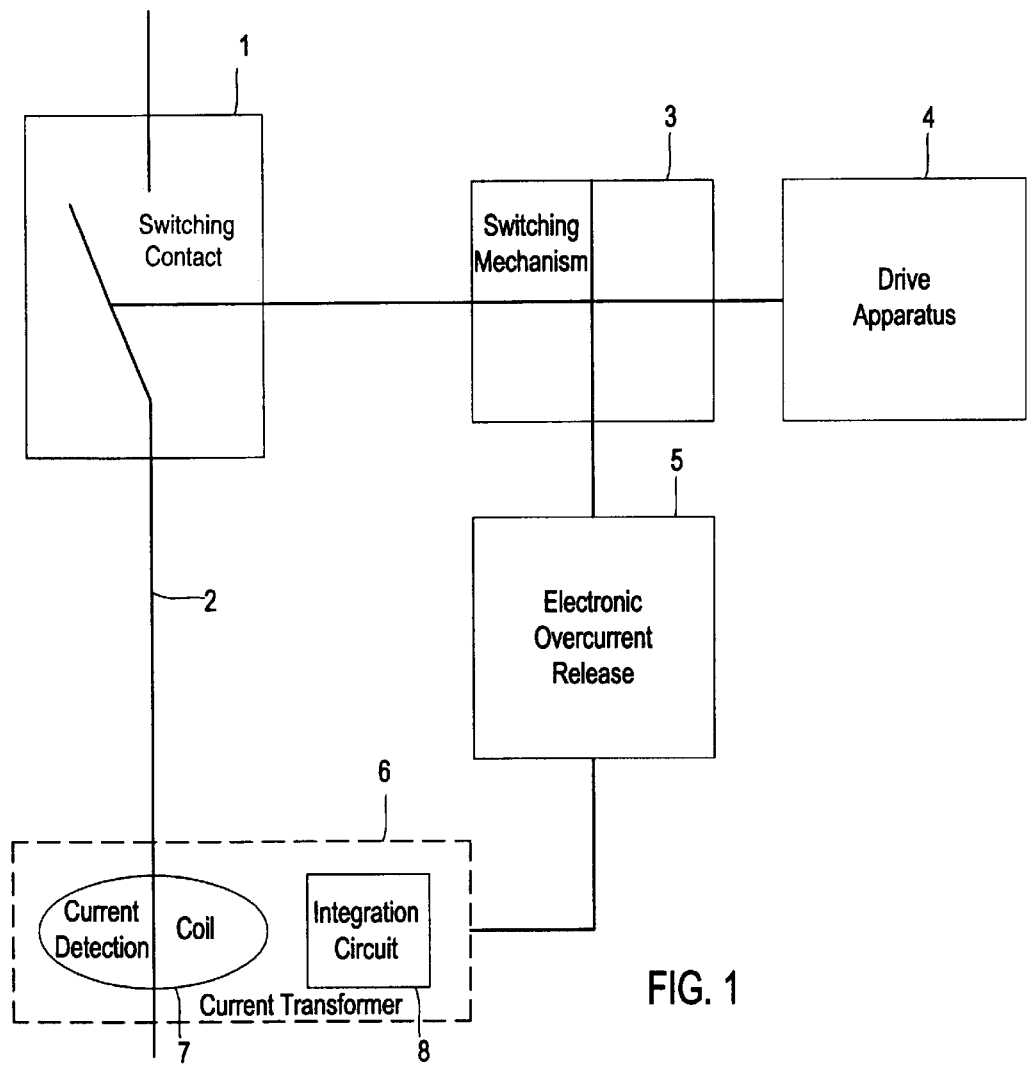
FIG. 1 shows an outline circuit diagram of a power circuit breaker with an electronic overcurrent release and a Rogowski current transformer.

FIG. 1 shows, as the main components of a low-voltage power circuit breaker, a switching contact 1, having one or more poles, in a main current path 2, a switching mechanism 3 and a drive apparatus 4. The switching mechanism 3, which is latched in the connected position of the switching contact 1, can be released by use of an electronic overcurrent release 5, to which a control signal, which is proportional to the current in the main current path 2, is supplied as an input variable. This control signal is provided by a current transformer 6, which is in the form of a transformer without any iron and having a wide dynamic range, and which contains an integration circuit 8 in addition to a Rogowski coil 7.

Figure 2:
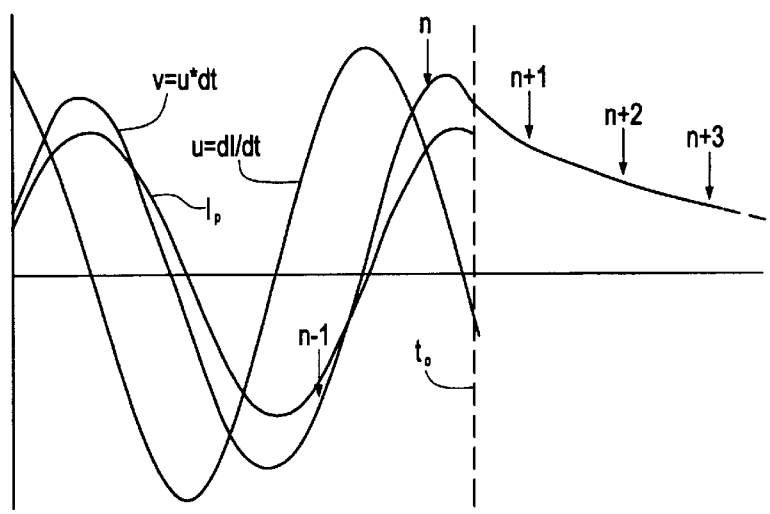
FIG. 2 shows a graph illustrating the profile of the primary current, the output variable of a current transformer and the output variable of an integrator, plotted against time.

The time profile of the measurement variables is shown in more detail in FIG. 2. In this figure, $I_p$ denotes the actual primary current in the circuit to be monitored. A voltage $u=dI/dt$ can be tapped off from the Rogowski coil of the current transformer. The integrator (8 in FIG. 1) which follows the Rogowski coil converts this voltage to a variable $v=\int u\,dt$. While the current $I_p$ and the voltage u end at the current interruption time, which is annotated $t_0$, the voltage v at the output of the integrator decays only gradually. The times at which instantaneous value detection is carried out are annotated n, n+1, n+2 and so on, as shown in FIG. 2, according to the flowchart. If these values have the same polarity and have a falling trend, then it is clear that there is a decaying DC element originating from the integrator. In this case, the tripping of the power circuit breaker is inhibited, thus avoiding any unnecessary disturbance in the supply to loads.

Figure 3:
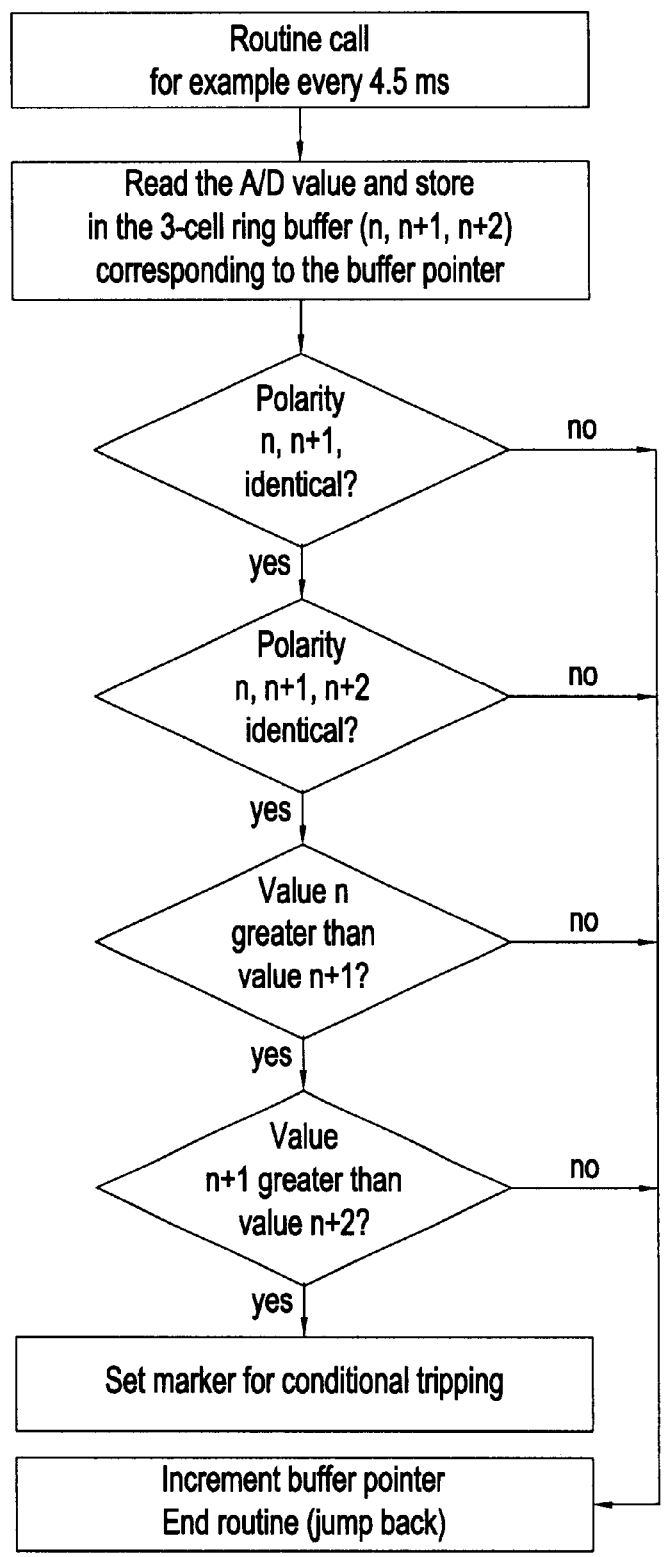
FIG. 3 shows a flowchart which illustrates the principle of the method according to the invention.

The flowchart shown in FIG. 3 starts with the periodic call of a test routine, with the periodic intervals being based on the decay function of the DC element of the integration circuit (8 in FIG. 1). An interval of about 4.5 ms between the test routines has been found to be reasonable. Measured values detected at these intervals are read in a three-cell ring buffer with the positions n, n+1 and n+2. The successive values stored in the ring buffer are now compared with one another, on the basis of polarity and magnitude. If the successive stored values have the same polarity and if their magnitudes increase, then this results, in the preconditions for conditional tripping. If, on the other hand, the values decrease monotonically, then this indicates a DC element which is not intended to lead to tripping. The routine is repeated in order to ensure correct operation of the power circuit breaker.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for operating an electronic overcurrent release for a power circuit breaker, including a current transformer for supplying the overcurrent release with a signal proportional to the current through the power circuit breaker, the current transformer including a current detection coil without iron, wherein an integration circuit is connected downstream from the current detection coil, the method comprising:
    a) measuring the instantaneous value of the current at defined periodic intervals,
    b) storing at least two successive measured values obtained in step a),
    c) comparing each of the measured values with at least two previously stored measured values, and
    d) outputting a tripping inhibit signal to the electronic overcurrent release if all the measured values correspond to a monotonically falling function and if the difference between successive measured values is at least 10%.

2. The method as claimed in claim 1, wherein the time interval between the measured values is relatively short in comparison to the time constant of the integration circuit.

3. The method of claim 2, wherein the time interval between the measured values is about 4.5 ms.

4. The method of claim 3, wherein the frequency of the current to be measured is about 50 Hz.

5. The method as claimed in claim 2, wherein for successively following comparison of the measured values, these measured values are read to a three-cell ring buffer.

6. The method as claimed in claim 1, wherein for successively following comparison of the measured values, these measured values are read to a three-cell ring buffer.

7. A method for operating an electronic overcurrent release for a power circuit breaker, including a current transformer for supplying the overcurrent release with a signal proportional to the current through the power circuit breaker, the current transformer including a current detection coil without iron, wherein an integration circuit is connected downstream from the current detection coil, comprising:
    increasing a tripping threshold value of the overcurrent release by a basic offset value for short-time-delay tripping and ground-fault tripping, wherein the basic offset value corresponds to a DC element which is emitted by the integration circuit in an event of an interruption in the current; and
    varying the basic offset value as a function of a decay function of the DC element.

* * * * *